United States Patent [19]

Massey

[11] 4,412,173

[45] Oct. 25, 1983

[54] APPARATUS USING LEAKAGE CURRENT FOR MEASURING RESISTIVITY

[75] Inventor: Gail A. Massey, San Diego, Calif.

[73] Assignee: The Oregon Graduate Center for Study and Research, Beaverton, Oreg.

[21] Appl. No.: 228,147

[22] Filed: Jan. 26, 1981

[51] Int. Cl.$^3$ .............................................. G01R 27/02
[52] U.S. Cl. ........................................ 324/62; 324/96
[58] Field of Search ..................... 324/62, 96, 97, 65 R

[56] References Cited

U.S. PATENT DOCUMENTS

| | | | |
|---|---|---|---|
| 3,662,263 | 5/1972 | Bensel | 324/96 |
| 3,699,649 | 10/1972 | McWilliams | 324/65 R UX |
| 4,070,621 | 1/1978 | Bassen et al. | 324/96 |

FOREIGN PATENT DOCUMENTS 54-128770 10/1979 Japan ..................................... 324/96

OTHER PUBLICATIONS

Cassidy et al., Development and Evaluation of Electro-optical High-Voltage Pulse Measurement Techniques, IEE Transactions on Instrumentation and Measurement, vol. IM-19, No. 4, Nov. 1970, pp. 395-402.

G. A. Massey and J. C. Johnson; D. C. Erickson, "Laser Sensing of Electric and Magnetic Fields for Power Transmission Applications", SPIE vol. 88, Polarized Light (1976), pp. 91-95.

G. A. Massey, D. C. Erickson, and R. A. Kadlec, "Electromagnetic Field Components: Their Measurement Using Linear Electrooptic and Magnetooptic Effects", Applied Optics/vol. 14, No. 11/ Nov. 1975, pp. 2712-2719.

Robert E. Hebner; Richard A. Malewski; Esther C. Cassidy, "Optical Methods of Electrical Measurement at High Voltage Levels", Proceedings of the IEEE, vol. 65, No. 11, Nov. 1977, pp. 1524-1548.

Primary Examiner—Stanley T. Krawczewicz
Attorney, Agent, or Firm—Kolisch, Hartwell & Dickinson

[57] ABSTRACT

Apparatus using leakage current through a sample to determine resistivity. An optically active material of the type which changes the polarization of a light beam passing therethrough, responsive to an electric field, is placed between a first pair of conducting plates. The sample is placed between a second pair of conducting plates which are in parallel connection with the first pair of plates. A light source transmits light through the material and a light detector detects changes in polarization of the light which emerges from the material. Each pair of plates is charged and the rate of discharge of the plates is monitored by the light detector.

9 Claims, 5 Drawing Figures

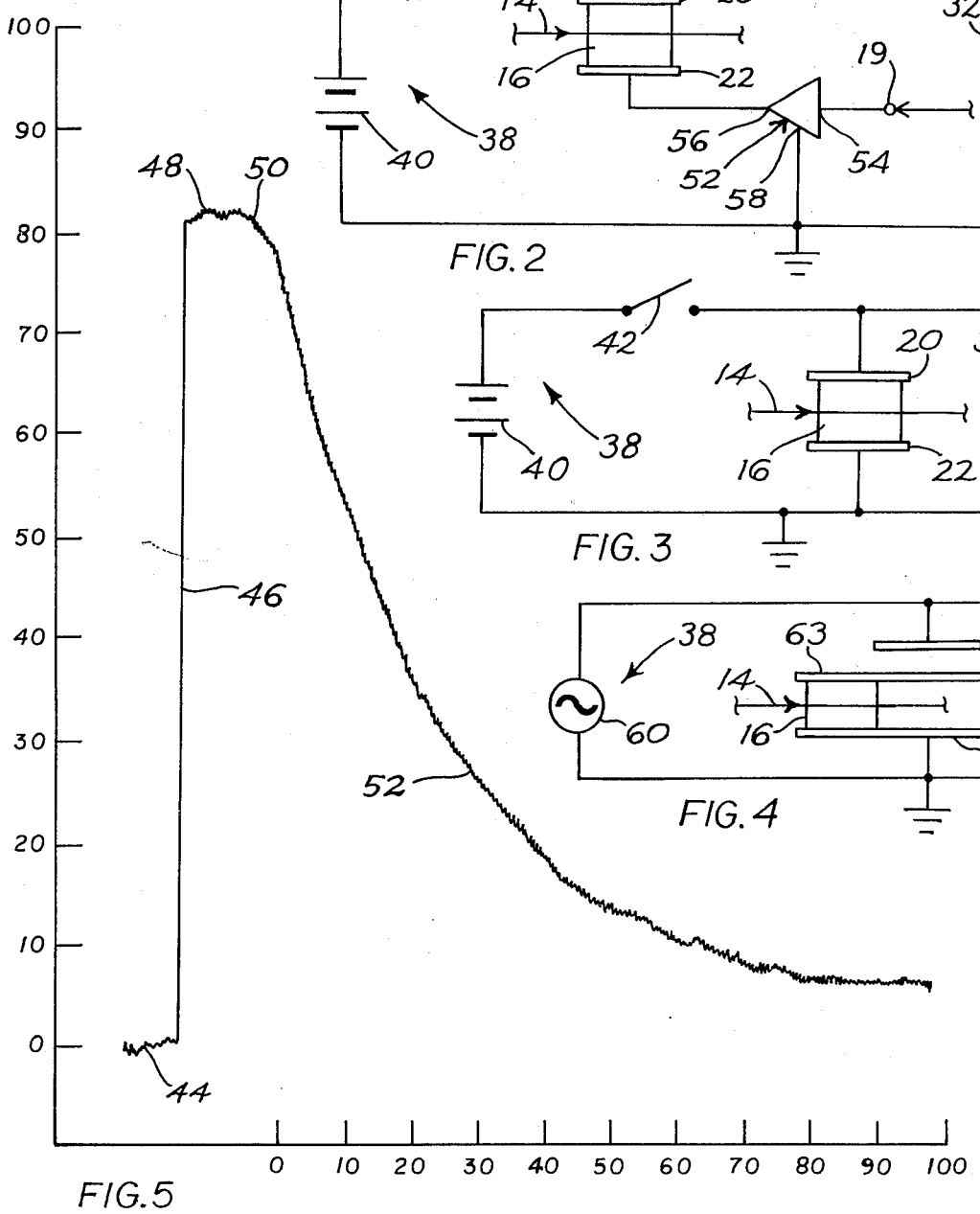

APPARATUS USING LEAKAGE CURRENT FOR MEASURING RESISTIVITY

BACKGROUND AND SUMMARY

This invention pertains to apparatus for measuring resistance, and more particularly, to apparatus which makes such a measurement by detecting leakage current through a sample, the resistance of which is being measured. Further, the invention detects such leakage current by monitoring the intensity of light transmitted through an optical system containing an electrooptic crystal.

The usual apparatus for measuring resistance, for example, an ohmmeter, places a voltage across a sample, the resistance of which is to be measured, and detects the current generated by the voltage. Although this method is reasonably adequate for measuring relatively low resistances, the higher the resistance of the sample to be measured, the greater the error is in a measurement. This is so because although such prior art devices are designed to have the highest possible impedance, it is not an infinite impedance and accordingly, the higher the resistance to be measured, the greater the error in the measurement.

A general object of the present invention is to provide resistance measuring apparatus which is particularly well suited for making accurate measurements of materials having high resistances.

A more specific object of the invention is to provide such an apparatus which makes such a measurement by detecting property changes in a light beam which is modulated by a voltage placed across a sample, the resistance of which is to be determined.

According to a preferred embodiment of the invention, an electrooptically active material having light polarization properties which are modulatable by an electric field is placed between a first pair of conducting plates. The polarization state of light transmitted through the material is related to the electric field in the material. Polarizing and analyzing filters are placed on either side of the material, so that the light intensity transmitted by the analyzing filter is proportional to the electric field. A second pair of conducting plates is connected in parallel with the first pair and the sample, the resistance of which is to be determined, is placed between the second pair. A polarized light beam is transmitted through the material between the first pair of plates and the intensity of the light transmitted by the analyzing filter is detected by a conventional photo detector. A charging source provides a potential difference between each pair of plates and is then removed. The charge discharges through both the material and the sample and while so doing, the intensity of light which is detected by the photo detector varies according to the rate of discharge. When the resistance to the electrooptic material is known, the resistance of the sample may be calculated.

In another embodiment of the invention the signal generated by the photo detector is provided to an amplifier, the output of which is connected to one of the plates between which the electrooptic material lies. The amplifier drives the potential of the plate to which it is connected during discharge so that a substantially zero potential is maintained across the first pair of plates. Thus, all discharge occurs through the sample and the resistance thereof may be computed without knowing the resistance of the electrooptic material.

Other features and advantages offered by the invention will become more fully apparent as the description which follows is read in conjunction with the accompanying drawings.

DESCRIPTION OF THE DRAWINGS

FIG. 1 is a partially schematic view of a portion of one embodiment of the invention.

FIG. 2 is a schematic of a portion of a second embodiment of the invention.

FIG. 3 is a schematic of a portion of the embodiment of FIG. 1.

FIG. 4 is a schematic diagram of a portion of a third embodiment of the invention.

FIG. 5 is a chart of an exemplary current generated by the photodetector during a resistance measurement.

DETAILED DESCRIPTION

Referring now to the drawings, illustrated generally at 10 in FIG. 1 is one embodiment of the resistance measuring apparatus. Included therein is a light source 12 which emits a beam of light 14. The beam passes through an electrooptic material 16 and is ultimately received by a photodetector 18. A terminal 19 in the photodetector provides a point for measuring the photocurrent output of the photodetector, such being proportional to the amount of light shining on photodetector 18. A first pair of plates 20, 22 are electrically connected (via wires 24, 26, respectively) to a second pair of plates 28, 30. A sample 32, the resistance of which is to be determined, is contained between the second pair of plates.

Material 16 is what is known as an electrooptic material, in the instant embodiment of the invention being a $LiNbO_3$ crystal. Such materials have very high electrical resistivities at room temperature and in addition, a property of light transmitted therethrough varies as a function of the electric field in which the material lies. With respect to the $LiNbO_3$ crystal, the property so varied is the polarization state of the light.

Light source 12 in the embodiment of FIG. 1 is a He-Ne laser having power rating of approximately 1-milliwatt. It is to be appreciated that monochromatic light is not required for successful operation of the invention. Filtered incoherent light also could be used as source 12. Light beam 14 passes through a conventional linear polarizer 34. The linearly polarized light emitted from polarizer 34 then passes through a conventional quarter-wave plate 36. Light emerging from plate 36 has been converted to circular polarization. The light then passes through material 16. Light emerging from the crystal passes through a conventional linear polarization analyzer 38 and is received by conventional photodetector 18. The photodetector and filters 38 are referred to herein collectively as a light detector.

A voltage source (not shown in FIG. 1) is illustrated schematically in FIG. 3 at 38. Included within source 38 is a 250-volt d.c. power supply 40 attached to a charging rod 42. When a measurement is to be made, rod 42 is brushed against either plate 20 or plate 28 to create potential difference between plates 20, 28 and plates 22, 30. When the rod is removed, the charge so created discharges through material 16 and through sample 32.

For a proper selection of the voltage value of power supply 40 and of the size of material 16, there is a linear relationship between the intensity of the light emerging from analyzer 38 (and detected by photodetector 18) and the value of voltage appearing across plates 20, 22. It is to be appreciated that one skilled in the art could make such a selection of crystal size and voltage values.

In operating the embodiment of FIG. 1, light source 12 is first activated. Of course, in the absence of an electric field, a constant quantum of light emerges, at a uniform rate, from analyzer 38 and is detected by detector 18. Accordingly, a constant photocurrent appears at terminal 19 of the photodetector. The measurement is begun by briefly contacting charging rod 42 with either plate 20 or plate 28 in order to apply a 250-volt charge between plates 20, 28 and plates 22, 30. In the presence of the 250-volt field, the crystal alters the polarization state of light passing therethrough. In the instant embodiment of the invention, the signal at terminal 19 sharply rises at the moment that the rod is applied to charge the plates. For so long as the rod is held against the plates, this high photocurrent output is maintained at terminal 19. When the rod is removed, discharge occurs through material 16 and sample 32 thus causing the photocurrent at terminal 19 to gradually decrease as the material alters the polarization state of the light responsive to the decaying electric field.

Turning to FIG. 5, the graph represents a plot of the photocurrent appearing at terminal 19 of the photodetector as it varies with respect to time during an exemplary resistance measurement of sample 32. The vertical scale of the plot has been divided into arbitrary units which represent variation in photocurrent appearing at terminal 19 of the photodetector. The horizontal scale is divided into seconds. Indicated generally at 44 is the steady state photocurrent level prior to application of an electric field with rod 42 as described above. A vertical portion 46 of the graph indicates the point at which the rod is first applied. At that point, the photocurrent output rises due to the increase in light intensity and maintains a constant high level, indicated generally at 48, until the point 50 at which the rod is removed. When the rod is removed, the photocurrent decays as shown due to the discharge of the field through material 16 and sample 32. When the capacitance C of the crystal-sample combination is known, the resistance R of the combination may be determined by the well-known equation as follows: $R = dt/C \ln(V_1/V_2)$ where dt is the time in which the voltage across the crystal decays from a value of $V_1$ to a value of $V_2$ and C is the capacitance of the crystal-sample combination. Using the chart of FIG. 5, where $V_1$ is represented by the value of the photocurrent at 50 and $V_2$ is represented by its value at 52, dt is thus a value of 30-seconds. Where the system capacitance is approximately 20 pF, the value of R is computed as $1.5 \times 10^{12}$ ohms. The value C is determined by conventional high frequency impedance or resonance methods.

In the system of FIGS. 1 and 3, the resistance of material 16 must be known in order to compute the resistance of sample 32. Additionally, when sample 32 approaches extremely high resistances (higher than that of material 16) the measurements are somewhat less accurate.

Turning to FIG. 2, a second embodiment of the invention being illustrated, an amplifier 52 is included therein. The amplifier has an input terminal 54, an output terminal 56, and a reference terminal 58. Other parts of the embodiment of FIG. 2 which correspond to similar parts in the embodiments of FIGS. 1 and 3 have been numbered the same as those previously-described parts.

It is to be appreciated that in the schematics of FIGS. 2 to 4, the light source, photodetector and associated polarizers and analyzer are not illustrated (to increase clarity); however, they are arranged for each of the embodiments as illustrated in FIG. 1. As shown in FIG. 2, the output terminal of the amplifier is connected to plate 22, the input terminal of the amplifier is connected to terminal 19 on the photodetector (not illustrated in FIG. 2) while the reference terminal of the amplifier is in common with plate 30 and with one side of power supply 40.

In operation of the embodiment of FIG. 2, when rod 42 is applied to plates 20, 28, the potential difference between plates 20, 22 is returned to zero by feedback of the photocurrent signal on terminal 19 via amplifier 54 to plate 22. When rod 42 is removed from plate 20, the decay in the photocurrent drives the amplifier so that during discharge, there is substantially zero potential difference between plates 20, 22. Thus, all the discharge occurs through sample 32. In the embodiment of FIG. 2, output terminal 56 of the amplifier serves as the measurement point. A voltage curve, like that illustrated in FIG. 5, is generated at terminal 56. Since substantially all of the discharge occurs through the sample, the resistance of material 16 need not be known to calculate the resistance of the sample. Additionally, the embodiment of FIG. 2 is more sensitive with respect to samples having higher resistances than material 16 since substantially all of the discharge occurs through the sample regardless of the resistance of material 16.

In the embodiment of FIG. 4, an a.c. voltage generator 60 is used in voltage source 38. A capacitive link 62 is used to couple one side of the alternating voltage generator to an upper plate 63 beneath which is material 16 and sample 32. A lower plate 64 completes the circuit to the other side of generator 60. Thus, in operation, the alternating charge is coupled across both the material and the sample thus creating an alternating photocurrent output on terminal 19 of the photodetector. When the capacitance of coupling 62 and the combined crystal-sample capacitance are each known, the crystal-sample combined resistance can be determined by conventional calculations based upon comparison of the phase shift between source 60 and the photocurrent appearing on terminal 19 of the photodetector. As has been previously mentioned, the capacitances of coupling 62 and of combined crystal-sample capacitance may be determined by conventional high frequency impedance or resonance methods.

In yet another embodiment of the invention (not illustrated) plate 64 is separated into a pair of conducting plates, one for material 16 and one for sample 32. An amplifier, like amplifier 52 in the embodiment of FIG. 2, is then used to maintain zero potential across material 16 so that all of the current flows through sample 32. This embodiment provides the same advantages as that of FIG. 2 with an a.c. voltage source.

The sample, the resistance of which is being measured, could consist of air. Such an application of the invention could be used for monitoring humidity or ionization of air.

While a preferred embodiment of the invention has been described, it is appreciated that variations and modifications may be made without departing from the spirit of the invention.

It is claimed and desired to secure by Letters Patent:

1. Apparatus for measuring electrical resistivity of a sample comprising an optically active material, said material being of the type which changes a property of a light beam passing therethrough responsive to changes in an electric field, a source for transmitting light through said material, a first pair of conductors between which lies said material, a second pair of conductors between which lies the sample, first connecting means electrically connecting one conductor in said first pair to one conductor in said second pair, second connecting means electrically connecting the other conductor in said first pair to the other conductor in said second pair, a source for selectively generating voltage between said second pair of conductors, and a light detector positioned to detect light emerging from said material, said detector being constructed to monitor such property changes of the emerging light.

2. The apparatus of claim 1 wherein said light beam property change is its degree of polarization and wherein said light detector is constructed to detect changes in light polarization.

3. The apparatus of claim 1, wherein one of said connecting means includes an amplifier for minimizing the electric field between said first pair of conductors, said amplifier having an input terminal, a reference terminal and an output terminal, said reference and output terminals extending in series in said one connecting means, and said input terminal being connected to the terminal in said light detector.

4. The apparatus of claims 1 or 2, wherein said voltage source provides a pulse voltage which discharges through the sample at a rate dependent upon its resistance.

5. Apparatus for measuring the leakage current through a sample of unknown resistivity, said apparatus comprising an optically active material of a known resistivity, said material being of the type which changes a property of a light beam passing therethrough responsive to changes in an electric field, a light source for transmitting light through said material, a light detector, positioned to detect the light from said source which emerges from said material, for generating an electric signal related to such property changes of the light received thereby, connecting means operatively disposed between said material and sample, said means placing said material and sample in parallel electrical connection, charging means for simultaneously placing an electric field across the material and said sample, and means for measuring said detector signal during discharge of such a field.

6. Apparatus for measuring leakage current through a sample of unknown resistivity, said apparatus comprising an optically active material, said material being of the type which changes a property of a light beam passing therethrough responsive to changes in an electric field, a light source for transmitting light through said material, a light detector having a terminal upon which appears an electrical signal related to such property changes of the light received by said detector, said detector being positioned to detect the light from said source which emerges from said material, a pair of conductors between which lies said material, a second pair of conductors between which lies the sample, means electrically connecting one conductor in said first pair with one conductor in said second pair, an amplifier having an input terminal and an output terminal, said input terminal being connected to the terminal in said light detector, said output terminal being connected to the other conductor in said first pair, and charging means for selectively applying a voltage pulse across said second pair of conductors, said detector signal driving said amplifier to maintain a substantially zero potential between said first conductors so that substantially all discharge occurs through the sample.

7. Apparatus for measuring leakage current through a sample having an unknown resistivity, said apparatus comprising an optically active material of a known resistivity said material being of the type which changes a property of a light beam passing therethrough responsive to changes in an electric field, a light source for transmitting light through said material, a light detector for generating an electrical signal related to such property changes of the light received thereby, said detector being positioned to detect the light from said source which emerges from said material, a pair of conductors between which lies both said material and the sample, and a voltage source electrically connected across said conductors for selectively applying voltage thereto.

8. A method for measuring the electrical resistivity of a sample comprising the step of, placing an optically active material between a first pair of conductors, said material being of the type which changes a property of a light beam passing therethrough responsive to changes in an electric field, placing the sample between a second pair of conductors, electrically connecting one conductor in said first pair to one conductor in said second pair, electrically connecting the other conductor in said first pair as the other conductor in said second pair, shining light through said material, detecting such property changes of the light which emerges from said material, and selectively applying voltage between the second pair of conductors.

9. A method for measuring leakage current through a sample of unknown resistivity comprising the steps of, placing an optically active material between a first pair of conductors, said material being of the type which changes the polarization of a light beam passing therethrough responsive to changes in an electrical field, placing the sample between a second pair of conductors, electrically connecting one conductor in the first pair with one conductor in the second pair, shining light through said material, generating a signal related to the polarization of light emerging from the material, placing such a signal on the input of an amplifier, connecting the output of the amplifier to the other conductor in the first pair, and selectively applying voltage between the second pair of conductors.

* * * * *